United States Patent [19]

Balestro et al.

[11] Patent Number: 5,555,272
[45] Date of Patent: Sep. 10, 1996

[54] SIGNAL PROCESSING DEVICE USING SEVERAL DIFFERENT FILTERINGS, ESPECIALLY FOR AUDIO-FREQUENCY CODING OF VOICE SIGNALS

[75] Inventors: Freddy Balestro; Patrice Senn, both of Grenoble, France

[73] Assignee: France Telecom, Paris, France

[21] Appl. No.: 228,479

[22] Filed: Apr. 15, 1994

[30] Foreign Application Priority Data

Apr. 16, 1993 [FR] France .................................. 93 04532

[51] Int. Cl.[6] ........................................................ H04B 1/38
[52] U.S. Cl. ........................ 375/220; 375/350; 379/411;
379/416; 379/420; 364/724.13; 364/724.19;
341/141; 341/143
[58] Field of Search ................................. 375/219, 220,
375/229, 254, 285, 296, 346, 348, 350;
379/388–390, 406, 410, 411, 420, 414,
416, 417; 455/14, 15, 78, 84; 364/724.13,
724.17, 724.19; 370/123; 341/126, 141,
144, 155, 143

[56] References Cited

U.S. PATENT DOCUMENTS

| | | | |
|---|---|---|---|
| 4,984,265 | 1/1991 | Connon et al. | 379/390 |
| 5,050,474 | 9/1991 | Ogawa et al. | 375/350 |
| 5,051,981 | 9/1991 | Kline | 370/32.1 |
| 5,131,032 | 7/1992 | Esaki et al. | 379/390 |
| 5,220,557 | 6/1993 | Kelley | 375/219 |
| 5,262,972 | 11/1993 | Holden et al. | 364/724.13 |

FOREIGN PATENT DOCUMENTS

| | | |
|---|---|---|
| 0212950 | 8/1980 | European Pat. Off. . |
| 0380350 | 1/1990 | European Pat. Off. . |
| 57-69939 | 4/1982 | Japan ......................................... 455/78 |

OTHER PUBLICATIONS

IEEE Journal of Solid State Circuits, vol. 15, No. 6, Dec. 1980 New York, pp. 1014–1021 Hiroshi Kuwahara et al "An Interpolative PCM CODEC With Multiplexed Ditital Filters".

Primary Examiner—Stephen Chin
Assistant Examiner—Amanda T. Le
Attorney, Agent, or Firm—Robbins, Berliner & Carson

[57] ABSTRACT

The device comprises a first input (E1) and a first output (S1) which are capable respectively of receiving and delivering a plurality of analog signals and corresponding digital signals having different predetermined types of transmission specifications and associated with substantially homothetic predetermined elementary frequency attenuation templates. A second input (E2) and a second output (S2) are also provided, capable respectively of receiving and delivering a plurality of digital signals and corresponding analog signals having different predetermined types of transmission specifications, associated with different, substantially homothetic predetermined elementary frequency attenuation templates, as well as first and second signal conversion means arranged respectively between the first input and output and between the second input and output and including a single digital filter (6) in common, having a single frequency attenuation template which is compatible with all the elementary templates.

13 Claims, 5 Drawing Sheets

SIGNAL PROCESSING DEVICE USING SEVERAL DIFFERENT FILTERINGS, ESPECIALLY FOR AUDIO-FREQUENCY CODING OF VOICE SIGNALS

BACKGROUND OF THE INVENTION

1. Field of the Invention

The invention relates to the processing of signals including the use of several digital filters having substantially homothetic templates, especially in the context of analog/digital and digital/analog conversions of signals capable of exhibiting different transmission specifications.

2. Description of the Related Art

The invention applies particularly but not exclusively to the audio-frequency coding devices which may be used for numerous applications of coding of high-quality voice signals. Such coding devices may be inserted into audio-frequency terminals, such as, for example, a telephone of the hands-free type.

A hand-free telephone includes an analog/digital conversion channel, called sending channel, starting from the microphone and going to the digital data transmission channel, as well as a digital/analog conversion channel, called reception channel, starting from the digital channel towards the loudspeaker of this telephone.

The signals flowing on these analog and digital channels must satisfy predetermined transmission specifications, generally governed by transmission standards, such as the CCITT G722 or CCITT G711 standards. The sending and reception channels of these devices include filterings, the frequency attenuation templates of which are specified on the basis of the transmission standards used. Moreover, the frequency attenuation templates are not identical in sending and in reception for a given standard. Hence it is necessary, in these devices, to provide as many digital filters as necessary frequency templates, which is restrictive from the installation and manufacturing cost point of view.

SUMMARY OF THE INVENTION

The invention aims in a general way to afford a more satisfactory solution, from the point of view of bulk and manufacturing cost in particular, to the problem of the use of several digital filters having substantially homothetic templates, as is the case, for example, in the G711 and G722 transmission standards.

The invention therefore proposes, in a general way, a signal processing device, including a single digital filter, the cutoff frequency of which depends on the frequency of sampling of the signal present at its input, and possessing a single predetermined frequency attenuation template compatible with a plurality of substantially homothetic predetermined elementary frequency attenuation templates and associated with different types of signals capable of being processed.

According to one embodiment of the invention, applicable more particularly to analog/digital and digital/analog conversion in the context of the coding of audio-frequency signals, the device comprises a first input and a first output, associated with a first transmission channel, for example the sending channel, which are capable of receiving and of delivering a plurality of analog signals and corresponding digital signals having different predetermined types of transmission specifications (meeting, for example, the G711 or G722 standards) and associated with predetermined and substantially homothetic elementary frequency attenuation templates (here for sending), as well as a second input and a second output associated with a second transmission channel (for example the reception channel) capable of receiving and delivering a plurality of digital signals and corresponding analog signals having different predetermined types of transmission specifications (also meeting the G711 or G722 standards, for example) and associated with predetermined and substantially homothetic elementary frequency attenuation templates (here for reception); the device also comprises first and second signal conversion means arranged respectively between the first input and output and between the second input and output and including the said single digital filter in common.

The two transmission channels respectively linking the two inputs and the two corresponding outputs advantageously possess a common serial bus on which the single serial digital filter is connected, as well as means for multiplexing and demultiplexing the digital samples originating from the signals received on the two inputs. Such a configuration makes it possible particularly to further reduce the implantation of the various elements of the device on a silicon chip.

According to one embodiment of the invention, the second channel linking the digital signal input to the analog signal output includes means for oversampling the input digital signal, these oversampling means preceding the single digital filter; moreover, the first channel, linking the analog signal input to the digital signal output, includes means for sub-sampling the digital signal originating from the digital filter.

When, as is the case, for example, in the G711 or G722 standards, for a corresponding pair of analog and digital signals meeting the same transmission specifications, that is to say, for example, the same transmission standard, the elementary frequency attenuation templates are different over the first channel and over the second channel (that is to say in reception and in sending), the frequency attenuation template of the single digital filter is then advantageously chosen on the basis of the most severe templates associated respectively with all the pairs of signals capable of being processed.

It has proven to be preferable to use an infinite-impulse-response recursive ladder filter as single digital filter.

According to one embodiment of the invention, applicable also to voice signal audio-frequency coding, the first transmission channel includes an analog/digital coder with shaping of the noise spectrum, such as a delta-sigma type coder, followed by a digital filter of the blocker type; in this case, the single digital filter advantageously incorporates a blocking circuit of order chosen to compensate for the effect of the digital filter of the blocker type situated behind the analog/digital coder; moreover, the second transmission channel includes a digital/analog coder with shaping of the noise spectrum, such as a delta-sigma coder, the working frequency of which is higher than that of the digital signal originating from the single digital filter; an interpolating filter is then advantageously provided, arranged between the output of the single digital filter and the input of the digital/analog converter.

When the signals to be processed are capable of meeting the standards CCITT G722 or CCITT G711, it has proven to be advantageous to use a serial recursive filter of the pole-zero type, them order of which is equal to 8 at least, and equal to 8 for preference.

Moreover, so as to minimize the energy consumption, the device advantageously includes means capable of matching the working frequency of the digital filter having regard to the frequency of sampling of the input signal of the filter and to its data rate.

BRIEF DESCRIPTION OF THE DRAWINGS

Other advantages and characteristics of the invention will become apparent on examining the detailed description of an embodiment of the invention which is not in any way limiting and is illustrated in the attached drawings, in which.

DESCRIPTION OF THE PREFERRED EMBODIMENTS

Although the invention is not in any way limited, as stated above, an embodiment of the invention will now be described making it possible to perform analog/digital and digital/analog conversion of audio-frequency signals received and delivered, for example, in a telephone of the hands-free type.

Figure 1:
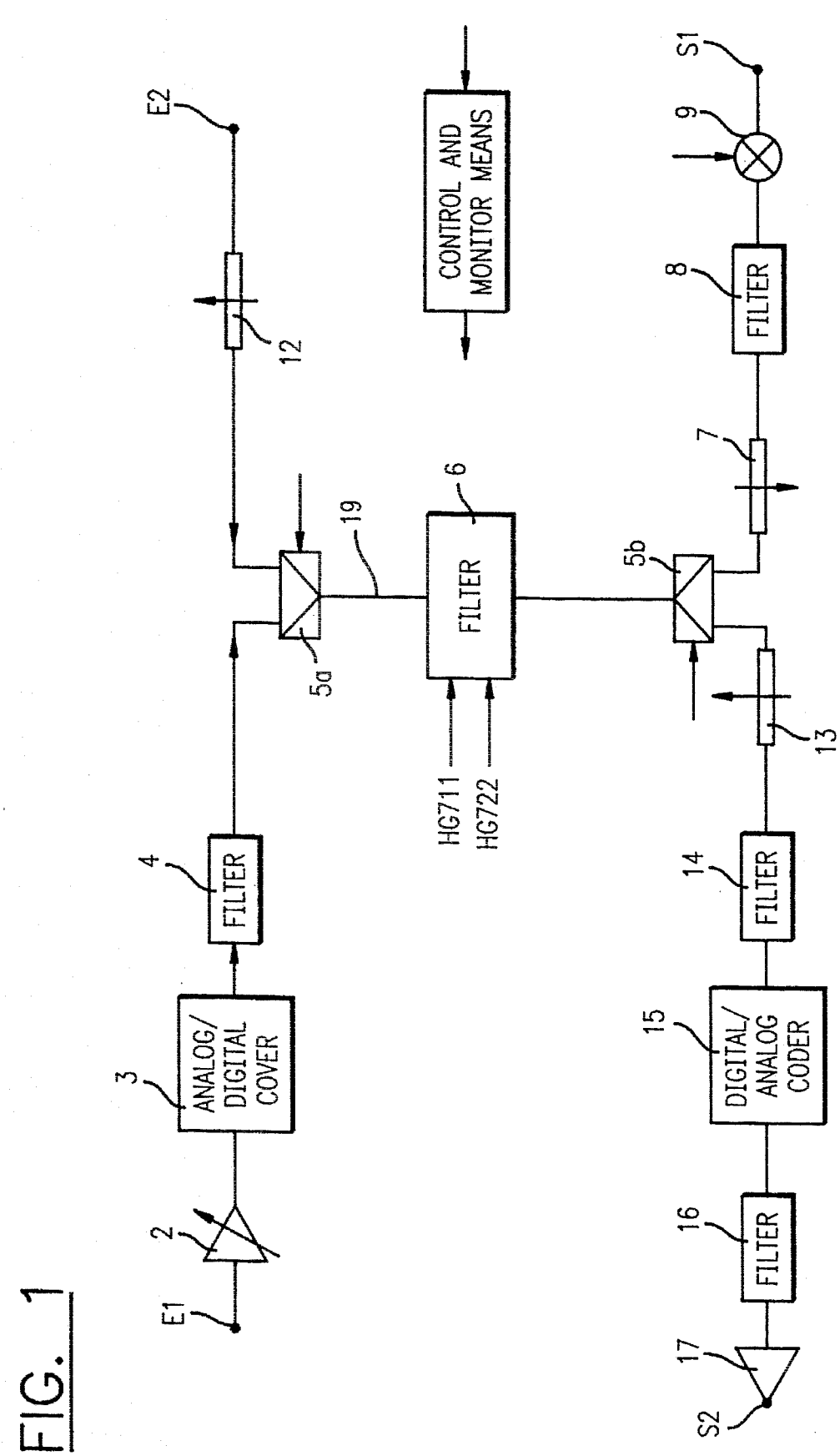
FIG. 1 is a block diagram of an embodiment of a device according to the invention.

As illustrated in FIG. 1, the device 1 includes a first input E1 linked via an analog transmission channel to the microphone of the telephone. This input E1 is linked to the input of a variable-gain amplifier 2 followed by an analog/digital coder 3 with shaping of the noise spectrum, for example a delta-sigma coder of order 3. Delta-sigma coders are particular types of coders with shaping of the noise spectrum, the purpose of which is to push back a part of the power of the noise outside the passband of the input signal, that is to say to perform shaping of this noise spectrum. The general structure of such coders has been the subject of numerous publications, in particular the French Patent 82 15 857, the content of which is for all practical purposes incorporated in the present description. The person skilled in the art may possibly refer thereto for more details.

The coder 3 is followed by a digital filter 4 here consisting of a blocking circuit of order 4, the transfer function of which can be altered on demand according to the nature of the signal, and is given by the formula $$((1-z^{-32})/(1-z^{-1}))^4 \quad \quad (I)$$

or by the formula $$((1-z^{-64})/(1-z^{-1}))^4 \quad \quad (II)$$

The purpose of this filter is to perform prefiltering of the digital signal in order to eliminate the major part of the noise and to reduce the frequency of sampling of the digital signal. In fact, although the frequency of sampling of the signal at the output of the coder 3 is, here, of the order of 2 MHz, the frequency of sampling of the signal originating from the filter 4 is 64 kHz (formula (I)) or 32 kHz (formula (II)).

The output bus from the digital filter 4 is a serial bus although the input bus is a parallel bus. Hence, there is provision for arranging a parallel/serial register at the output of the filter 4, or, better, for producing a digital filter 4 operating partly in parallel and partly in serial mode.

The output of the digital filter 4 is linked via a multiplexer 5a and a serial digital bus 19 to the input of a serial digital filter 6, of the infinite-impulse-response recursive ladder type. The structure of such a filter will be set out in more detail below.

The output of this filter 6 is linked by another part of the serial bus 19 and via a demultiplexer 5b to means 7 for sub-sampling the digital signal originating from the filter 6. The output of the sampling means 7 is linked to a high-pass digital filter 8, the purpose of which is to remove the DC component of the signal. The output of this high-pass filter 8 is linked to a multiplier, the output of which is linked to a first output S1 of the device. According to the nature of the output signal from the high-pass filter, the latter is multiplied by a different multiplier coefficient so as to perform a level adjustment on the output signal.

Although the first input E1 and the first output S1 define a first transmission channel, here the sending channel, the device 1 includes a second input E2 and a second output S2, defining a second transmission channel, here the reception channel. A means 12 of oversampling the digital signal received at the second input E2 is linked to this input. The output of the means 12 is linked to the other input of the multiplexer 5a. The second transmission channel carries on through the bus 19 and the digital filter 6, in common with the first transmission channel. The second output of the demultiplexer 5b is followed by another oversampling means 13, the output of which is linked to a digital/analog coder 15, (also with noise shaping, a delta-sigma coder of order 2 in this instance), via a digital/interpolating filter 14, for example in $\sin^2$ (sine squared) mode. In fact, the sampling frequency of the digital/analog coder 15 is higher than the frequency of oversampling of the signal originating from the means 13. The interpolating filter 14 allows this increase in sampling frequency, while preserving the quality of the digital signal.

The output of the coder 15 is followed by an analog filter 16 and by an amplifier 17, the output of which is linked to the second analog output S2 linked to the loudspeaker of the telephone.

Means 18 are also provided for control and monitoring of the device, in order to modify the transfer function of the input filter 4 and to deliver the control signals for the various multiplexers, oversampling or subsampling means, and also including a phase-locked loop, as well as a sequencer for delivering clock signals at different frequencies for clocking the various elements of the device.

The device according to the invention is capable of processing analog and digital signals meeting the CCITT G722 or CCITT G711 transmission standards. Hence, the G711 transmission standard specifies coding of an audio-frequency signal with a bandwidth of 4 kHz for the purposes of transmitting it on a digital bus at a data rate less than or equal to 32 kbit/s, typically with a sampling frequency of the order of 8 kHz, while the CCITT standard G722 specifies coding of an audio-frequency signal with a bandwidth of 7 kHz for the purposes of transmitting it on a digital bus with a data rate less than or equal to 64 kbit/s, and a sampling frequency typically of the order of 16 kHz.

Figure 2A:
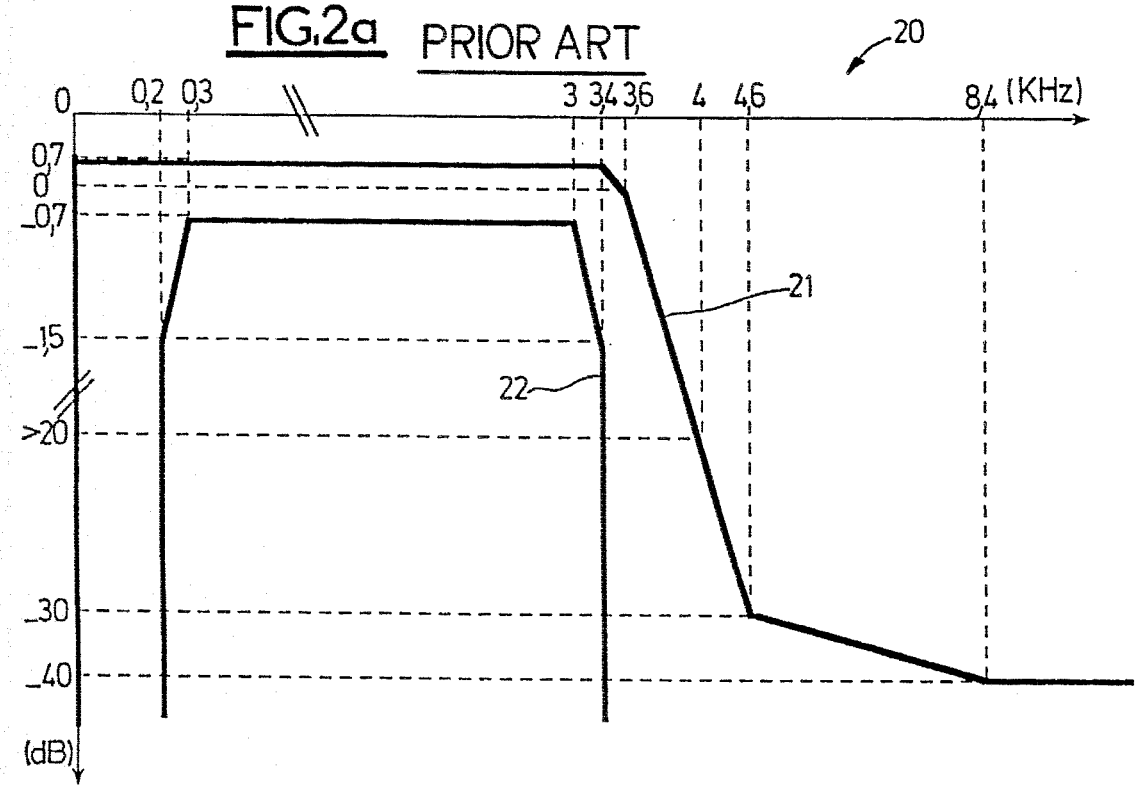
FIGS. 2a and 2b illustrate elementary frequency attenuation templates, in sending and in reception, which are specified by the CCITT standard G711.
Figure 2B:
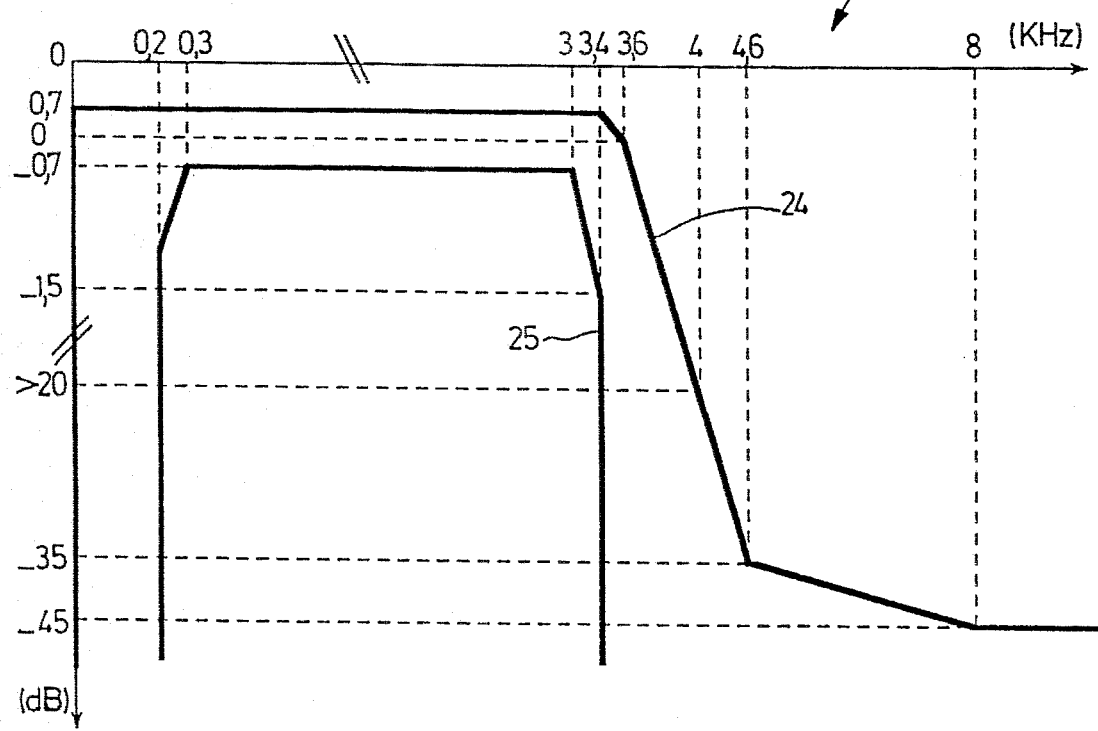

The CCITT standard G711 also specifies that the coding device should have a filter having a frequency attenuation template, in sending mode, such as illustrated in FIG. 2a and, in reception, a frequency template such as illustrated in FIG. 2b.

Thus, the template 20 of the sending filter of the G711 standard shows that this low-pass filter possesses a cutoff frequency of 3.4 kHz. This template 20 is delimited by an upper envelope 21 and a lower envelope 22. The reception filter also possesses a cutoff frequency of 3.4 kHz and is defined by a template 23 delimited by an upper envelope 24 and a lower envelope 25. It is appropriate to note here that the template 23 of the reception filter is more severe than the template 21 of the sending filter, since the envelope 24 is situated partly below the corresponding envelope 21 whereas the envelope 25 is situated partly above the envelope 22.

Figure 3A:
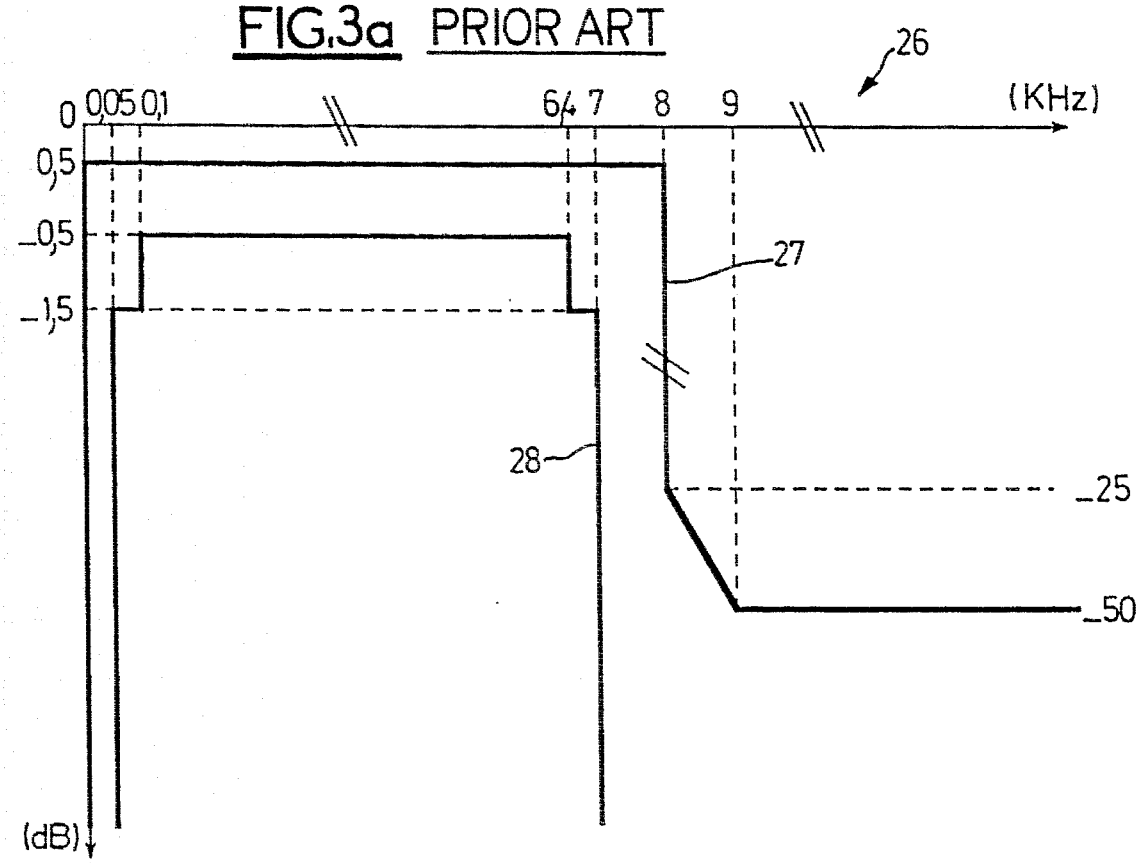
FIGS. 3a and 3b illustrate such elementary templates for the CCITT standard G722.
Figure 3B:
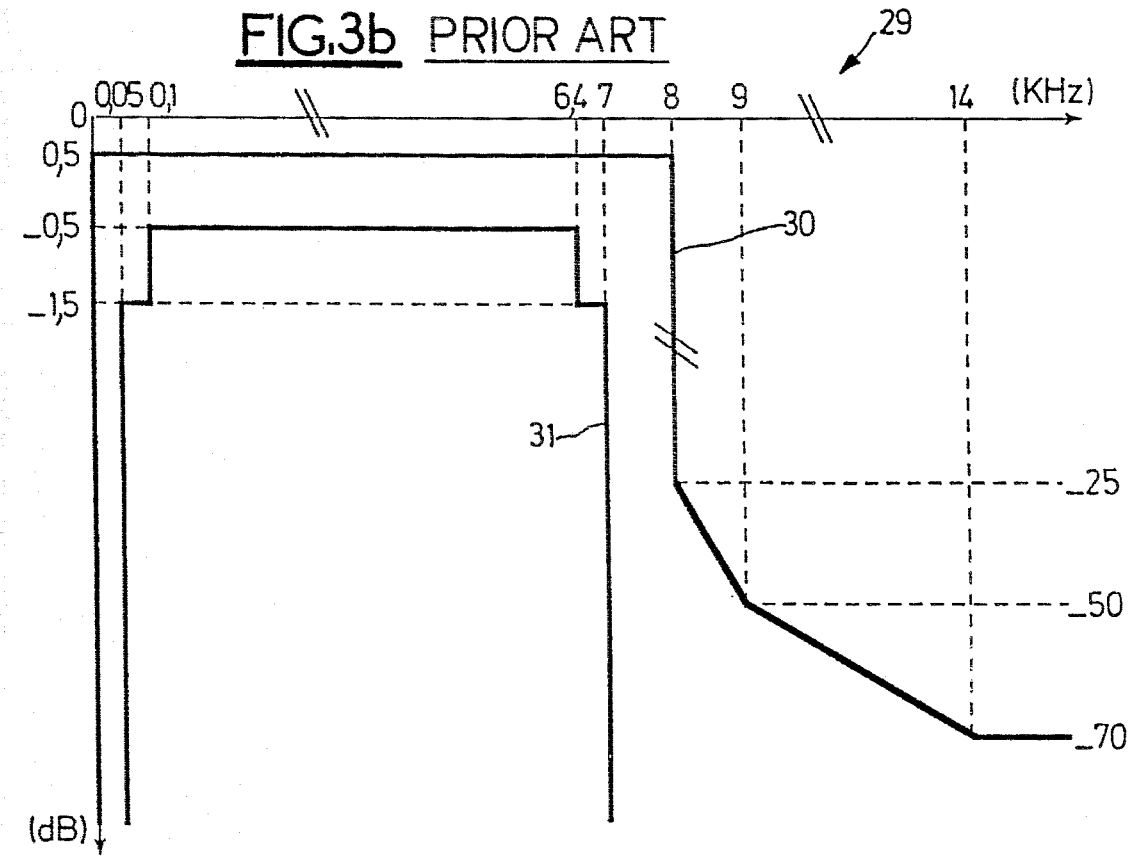

The sending and reception filters which are specified by the CCITT standard G722 are low-pass filters having a cutoff frequency of about 7 kHz. Their respective templates 26 and 29, illustrated in FIGS. 3a and 3b, are delimited by upper 27 and 30 and lower 28 and 31 envelopes. Here again, the reception filter has a frequency template which is more severe than that of the sending filter, since the upper envelope 30 is situated partly below the upper envelope 27 of the sending filter, whereas the lower envelope 31 of the reception filter is substantially identical to that 28 of the sending filter.

The person skilled in the art may refer for more information relating to the standards CCITT G711 and CCITT G722 to the corresponding recommendations available from the Union Internationale des Télécommunications, Place des Nations, Geneva, Switzerland.

The person skilled in the art will note that the templates of the filters specified by the G711 and G722 standards are substantially homothetic in a ratio of approximately 2, their respective cutoff frequencies being in a ratio of about 2, which corresponds to the ratio of the sampling frequencies of the digital signals. One essential characteristic of the invention consists in providing a single digital filter, low-pass in this instance, having a cutoff frequency Fc depending on the sampling frequency Fe of the digital signal present at its input, in the form of a ratio r (Fc=Fe/r), and possessing a single frequency template compatible with all the elementary frequency templates of all the types of signals capable of being processed. In practice, in the present case, for a given transmission standard, the most severe sending or reception filter is chosen, here, in this instance, the reception filter. Then, from the templates of the two reception filters, the single frequency template of the resultant filter is determined, in such a way that it is compatible with the two most severe elementary frequency templates. In the particular example of the G711 and G722 standards, for a given sampling frequency, a single frequency template 32 is obtained, illustrated in FIG. 4 and, for this sampling frequency, possessing a cutoff frequency of the order of 7 kHz, with an upper envelope 33 and a lower envelope 34. Such a template is directly compatible with the G722 transmission standard, that is to say that the upper envelope 33 will never be above the upper envelope 30 of the template of the reception filter, and that the lower envelope 34 will never be below the lower envelope 31 of this same template. Moreover, since the cutoff frequency of such a filter is proportional to the frequency of sampling of the signal present at its input, it suffices, in order to obtain a template compatible with G711 transmission standards, to divide the sampling frequency of the digital signal present at the input of the filter by two, in order to obtain a cutoff frequency of the order of 3.4 kHz, and a template compatible with that of the sending and reception filters of the G711 standard.

Figure 5:
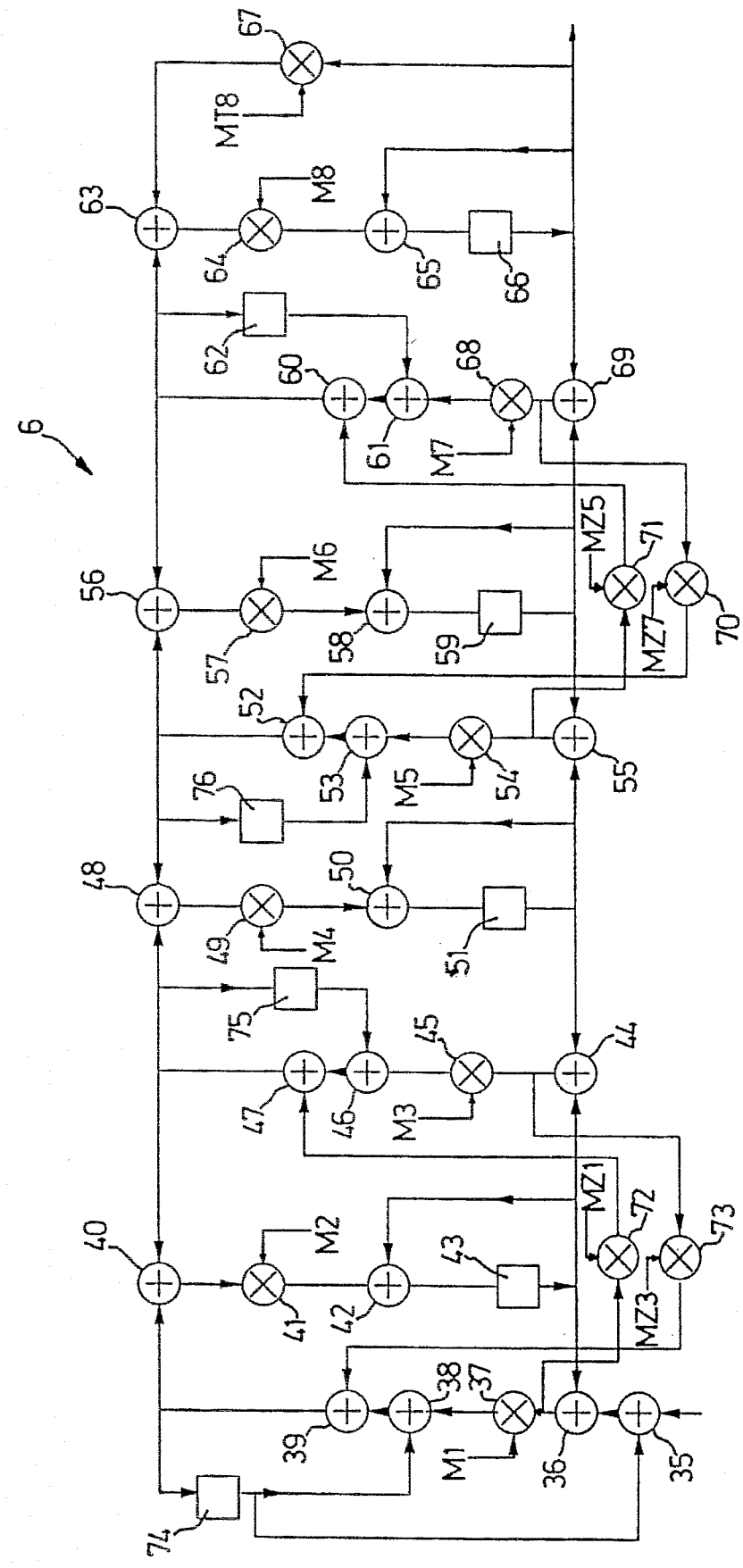

FIG. 5 illustrates one embodiment of a recursive ladder filter of order 8 used in the present application.

This filter essentially includes adders, multipliers and delays with transfer function $Z^{-1}$. The input of the filter 6 is linked to the first input of an adder 35 followed, in order and in series, by an adder 36, by a multiplier 37 and by two adders 38 and 39. The output of the adder 39 is looped back onto the second input of the adder 36 by a chain composed, in order and in series, of an adder 40, of a multiplier 41, of an adder 42 and of a delay 43. The output of the adder 39 is also looped back, via a delay 74, on the one hand onto the second input of the adder 38 and, on the other hand, onto the second input of the adder 35.

The output of the delay 43 is looped back onto the second input of the adder 40 via a chain composed, in order and in series, of an adder 44, of a multiplier 45, of an adder 46 and of an adder 47. The output of the delay 43 is also looped back onto the second input of the adder 42 which precedes it. Moreover, the output of the adder 36 is linked to the second input of the adder 47 via a multiplier 72, while the output of the adder 44 is linked to the second input of the adder 39 via a multiplier 73.

The output of the adder 47 is looped back, on the one hand, onto the second input of the adder 46 via a delay 75 and, on the other hand, onto the second input of the adder 44 via a chain composed, in order and in series, of an adder 48, of a multiplier 49, of an adder 50 and of a delay 51.

The output of the delay 51 is also looped back, on the one hand, onto the second input of the adder 50, and, on the other hand, onto the second input of the adder 48 via a chain composed, in order and in series, of an adder 55, of a multiplier 54, of an adder 53 and of another adder 52. The output of the adder 52 is also looped back onto the second input of the adder 53 which precedes it via a delay 76.

The output of the adder 52 is also looped back onto the input of the adder 55 via another chain constituted, in order and in series, by an adder 56, by a multiplier 57, by an adder 58 and by a delay 59. The output of the delay 59 is looped back, on the one hand, onto the second input of the adder 58, and, on the other hand, onto the second input of the adder 56 by a chain constituted, in order and in series, of an adder 69, of a multiplier 68, of an adder 61 and of another adder 60.

Moreover, the output of the adder 55 is linked to the second input of the adder 60 via a multiplier 71, while the output of the adder 69 is linked to the second input of the adder 52 via a multiplier 70.

Moreover, the output of the adder 60 is linked, on the one hand, to the second input of the adder 61 which precedes it via a delay 62, and, on the other hand, to the second input of the adder 69 by a chain constituted, in order and in series, by an adder 63, by a multiplier 64, by an adder 65 and by a delay 66.

The last loop of this filter is formed by a multiplier 67 which links the output of the delay 66 to the second input of the adder 63, the output of the delay 66 being, moreover, also linked directly to the second input of the adder 65 which precedes it. The output of the filter is formed by the output of the delay 66.

The transfer function of this filter of order 8 includes poles and zeros. The coefficients of the filter M1 to M8 and MT8, MZ1, MZ3, MZ5 and MZ7 are applied respectively to the multipliers 37, 41, 45, 49, 54, 57, 68, 64, 67, 72, 73, 71 and 70.

Figure 4:
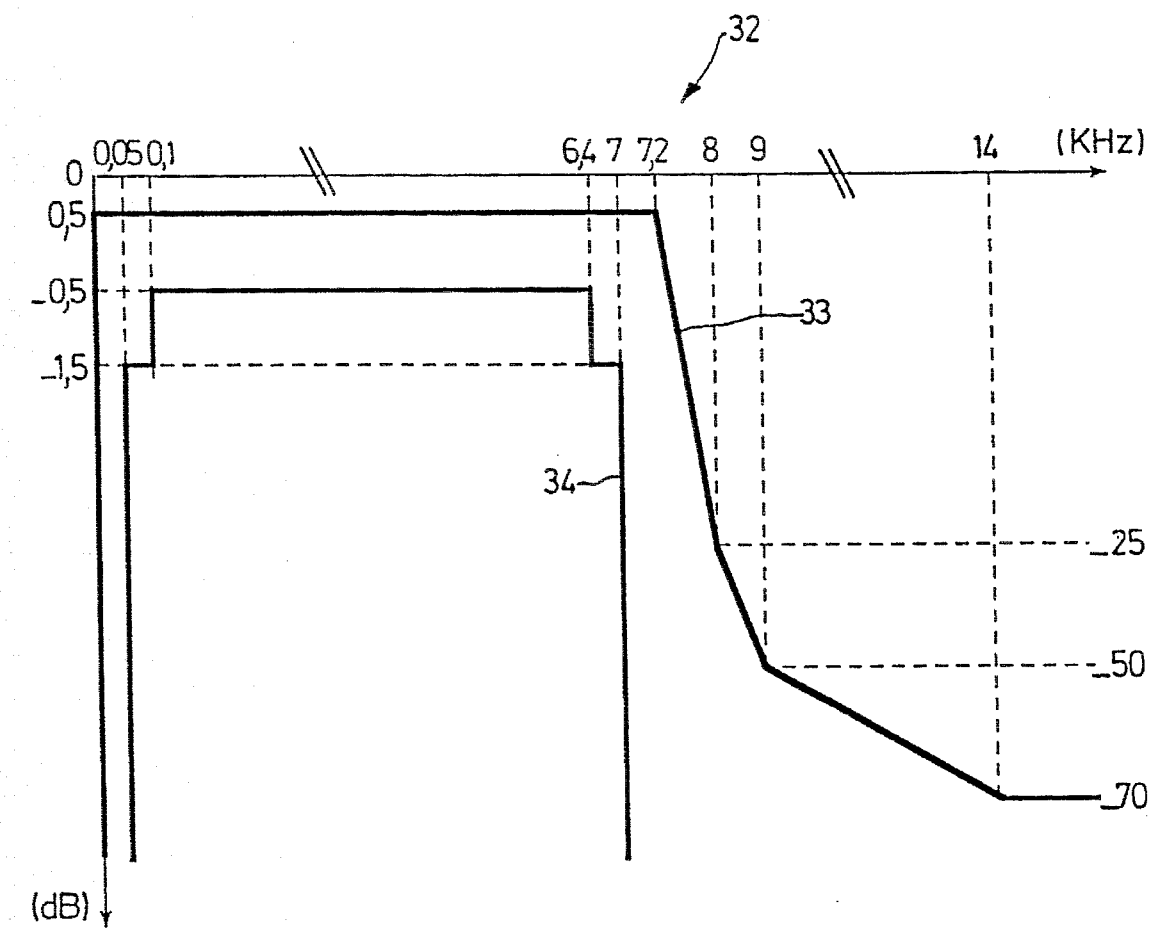
FIG. 4 illustrates a frequency attenuation template for a single digital filter which is usable in the invention, and FIG. 5 diagrammatically represents an embodiment of a digital filter meeting the frequency template of FIG. 4.

The coefficients of this filter, the values of which are given in the annex, have been calculated for a sampling frequency of the digital signal present at the input of the filter of 64 kHz, and for the frequency template illustrated in FIG. 4 with a cutoff frequency of the order of 7 kHz corresponding to the G722 transmission mode. These coefficients also incorporate a correction from a blocking circuit of order 4 in terms of $\sin^4$, in order to take account of the perturbation contributed by the input filter 4.

Such a digital filter has a cutoff frequency inversely proportional to the sampling frequency of the digital signal present at the input. Hence, in order to obtain the frequency template usable in G711 mode, it will suffice to present, at the input of the filter 6, a digital signal with a sampling frequency which is half of that for which it has been specified, that is to say a sampling frequency of 32 kHz in the present case.

The digital signal originating from the input E2 has in fact been oversampled before filtering so as to avoid the problems of frequency aliasing which are well known to the person skilled in the art. Moreover, the signal originating from the digital filter and intended for the analog output S2 is oversampled in the oversampler 13, at least as far as the G711 transmission standard is concerned, in such a way as to obtain a sampling frequency of 64 kHz at the input of the inter-polator 14, the output frequency being of the order of 256 kHz.

Moreover, the digital signal originating from the filter 6 but intended for the digital output S1 is sub-sampled in the sub-sampler 7 in such as way as to obtain a sampling frequency of 16 kHz, at the high-pass filter 8 stage.

Having regard to the multiplexing of the digital samples originating respectively from the output of the filter 4 (the transfer function of which has been adapted depending on the standard used (formula I: G722; formula II: G711)) and from the input E2, alternating sending and reception samples are obtained on the common serial bus 19, which, needless to say, imposes a high operating speed on the filter 6, which is compatible with the frequency bands used in the present application. In practice, in G722 transmission mode, the information data rate on the bus 19 will be of the order of 4 Mbits/second, while it will be of the order of 2 Mbits/second in the G711 transmission mode by reason of the division by 2 of the sampling frequency of the digital signal. The working frequency of the digital filter must, needless to say, be matched to these data rates. It could in fact be single whatever the transmission mode as long as it is matched to the higher data rate. Nevertheless, for reasons of consumption, it is preferable to adjust the working frequency of the filter to the optimum. In practice, in the case of a G722 transmission standard the circuit 18 delivers a clock signal HG722 corresponding to a working frequency of 4 MHz, while the working frequency will be switched to 2 MHz (clock signal HG711) in the case of a G711 transmission standard.

It has been judged to be preferable, in the application described, to use a filter of order eight in order to obtain greater precision and lower fluctuation in the working band. Moreover, the use of a filter of "pole-zero" type makes it possible to obtain a more rapid transition band with respect to an "all pole" filter.

The combination of a single digital filter and of series processing of the samples allows a significant saving in space for such a circuit implanted in an integrated way on a silicon chip.

In the embodiment described, matching of the G711 standard to the G722 standard or conversely is carried out, not just by modifying the working frequency of the single filter 6, but also by the use of variable and controllable oversampling or sub-sampling means, and by the modification of the transfer function of the input filter 4.

It would also be possible, in a variant, to provide identical oversampling 12 and sub-sampling 7 means whatever the standard used, to dispense with the oversampling means 13, to provide an input filter 4 having a single transfer function according to the formula (I), and simply to divide by two the working frequencies of all the elements of the device upon passing from the G722 standard to G711, under the action of the control means 18. In practice, in the present case, the working frequencies, adopted by the G722 standard, for the elements 2 to 4 would be 2 MHz and 4 MHz for the elements 6, 15, 16, the oversampling or sub-sampling coefficient being then chosen to be equal to 4. The working frequency mentioned above would be divided by two in the case of the G711 standard.

| ANNEX | |
|---|---|
| M1 = | −0.302886 |
| M2 = | 0.755606 |
| M3 = | −0.230629 |
| M4 = | 0.525378 |
| M5 = | −0.229252 |
| M6 = | 0.855246 |
| M7 = | −0.241719 |
| M8 = | 0.756512 |
| MT8 = | −0.483880 |
| MZ1 = | 0.0436355 |
| MZ3 = | 0.0436355 |
| MZ5 = | 0.0532919 |
| MZ7 = | 0.0532919 |

We claim:

1. A signal processing device, comprising:

a filter input receiving a signal with a frequency of sampling;

a single digital filter having a cutoff frequency which depends upon the sampling frequency of said signal, said single digital filter also having a single predetermined frequency attenuation template which is compatible with a plurality of substantially homothetic predetermined elementary frequency attenuation templates of different types of signals processed by said signal processing device;

a first input and a first output for respectively receiving and delivering a plurality of analog signals and corresponding digital signals having different predetermined types of receiving and delivering transmission specifications associated with substantially homothetic predetermined elementary frequency attenuation templates;

a second input and a second output for respectively receiving and delivering a plurality of digital signals and corresponding analog signals having different predetermined types of receiving and delivering transmission specifications associated with different, substantially homothetic predetermined elementary frequency attenuation templates;

first signal conversion means arranged between the first input and the first output;

second signal conversion means arranged between the second input and the second output;

wherein the single digital filter is commonly connected to said first and second signal conversion means;

a first transmission channel linking the first input with the first output;

a second transmission channel linking the second input with the second output;

a serial bus connected to said single digital filter and commonly connected to said first and second transmission channels;

means for multiplexing digital samples originating from signals received on said first and second inputs; and means for demultiplexing digital samples originating from signals received on said first and second inputs;

wherein the first channel comprises:

an analog/digital coder with shaping of a noise spectrum;

a blocker-type digital filter coupled to said analog/digital coder;

wherein the single digital filter incorporates a blocking circuit of order chosen to compensate for effects of the blocker-type digital filter;

wherein the second channel comprises:

a digital/analog coder with shaping of a noise spectrum and having a working frequency higher than frequency of digital signal originating from the single digital filter; and further comprises an interpolating digital filter coupled between an output of the single digital filter and an input of the digital/analog coder.

2. A device as in claim 1, wherein the second channel links a digital signal input to an analog signal output and includes means for oversampling the digital input signal prior to said signal entering said single digital filter; and wherein said first channel links an analog signal input to an digital signal output and includes means for subsampling the digital signal originating from the single digital filter.

3. A device as in claim 2, wherein, for a pair of corresponding analog and digital signals with same transmission specifications, said elementary frequency attenuation templates are different over the first channel and over the second channel; and wherein the frequency attenuation template of the single digital filter is chosen based upon the most severe elementary frequency attenuation templates associated respectively with all pairs of signals capable of being processed by said device.

4. A device as in claim 3, wherein the analog/digital coder is a delta-sigma coder and wherein the digital/analog coder is a delta-sigma coder.

5. A device as in claim 4, wherein the single digital filter is an infinite-impulse-response recursive ladder filter.

6. A device as in claim 5, wherein the first and second conversion means are capable of processing signals having transmission specifications defined by the CCITT G722 and CCITT G711 standards, and wherein the recursive ladder filter is a serial filter of pole-zero type and of order at least equal to 8.

7. A device as in claim 6, further comprises means for modifying working frequency of the single digital filter as a function of a transmission specification used.

8. A device as in claim 6, further comprises means for dividing working frequency of elements of the device by two.

9. A device as in claim 1, wherein the analog/digital coder is a delta-sigma coder and wherein the digital/analog coder is a delta-sigma coder.

10. A device as in claim 1, wherein the single digital filter is an infinite-impulse-response recursive ladder filter.

11. A device as in claim 1, wherein the first and second conversion means are capable of processing signals having transmission specifications defined by the CCITT G722 and CCITT G711 standards, and wherein the recursive ladder filter is a serial filter of pole-zero type and of order at least equal to 8.

12. A device as in claim 11, further comprises means for modifying working frequency of the single digital filter as a function of a transmission specification used.

13. A device as in claim 11, further comprises means for dividing working frequency of elements of the device by two.

* * * * *